United States Patent

Matviya

(10) Patent No.: US 7,960,656 B2
(45) Date of Patent: Jun. 14, 2011

(54) CARBON BONDED CARBON FOAM EMI SHIELDING ENCLOSURES

(75) Inventor: Thomas M. Matviya, McKees Rocks, PA (US)

(73) Assignee: Touchstone Research Laboratory, Ltd., Triadelphia, WV (US)

( * ) Notice: Subject to any disclaimer, the term of this patent is extended or adjusted under 35 U.S.C. 154(b) by 0 days.

(21) Appl. No.: 11/421,845

(22) Filed: Jun. 2, 2006

(65) Prior Publication Data

US 2007/0278003 A1    Dec. 6, 2007

(51) Int. Cl.
*H01R 4/00* (2006.01)
(52) U.S. Cl. .......................... 174/363; 277/920; 174/377
(58) Field of Classification Search .................. 174/350, 174/377, 382, 363; 361/816, 818; 403/23; 277/920
See application file for complete search history.

(56) References Cited

U.S. PATENT DOCUMENTS

| | | | |
|---|---|---|---|
| 2,513,274 A | 7/1950 | Barkhuff | |
| 5,501,729 A | 3/1996 | Lewis | |
| 5,687,470 A * | 11/1997 | Halttunen et al. | 29/592.1 |
| 6,033,506 A | 3/2000 | Klett | |
| 7,039,361 B1 * | 5/2006 | Collins | 455/63.1 |
| 2004/0258605 A1 | 12/2004 | Joseph | |
| 2007/0277704 A1 | 12/2007 | Lucas | |
| 2007/0277705 A1 | 12/2007 | Lucas | |
| 2007/0278003 A1 | 12/2007 | Matviya | |
| 2007/0281116 A1 | 12/2007 | Matviya | |
| 2007/0281162 A1 | 12/2007 | Matviya | |
| 2007/0281163 A1 | 12/2007 | Matviya | |

FOREIGN PATENT DOCUMENTS

GB    2254829    10/1992

* cited by examiner

*Primary Examiner* — Hung V Ngo
(74) *Attorney, Agent, or Firm* — Philip D. Lane

(57) ABSTRACT

Enclosures for at least partially shielding an at least partially enclosed volume from electromagnetic interference and various methods for producing such enclosures are described. Enclosures for at least partially shielding an at least partially enclosed volume from electromagnetic interference may be prepared by bonding at least two sections of carbon foam with a carbonizable binder to provide an enclosure, wherein said enclosure defines an at least partially enclosed volume, and carbonizing the carbonizable binder to provide an electrically conductive carbon char. An enclosure for at least partially shielding an at least partially enclosed volume from electromagnetic interference may include at least two sections of electrically conductive carbon foam interconnected by an electrically conductive carbon char. The electrically conductive carbon char is substantially electrically continuous with the sections of electrically conductive carbon foam.

12 Claims, 4 Drawing Sheets

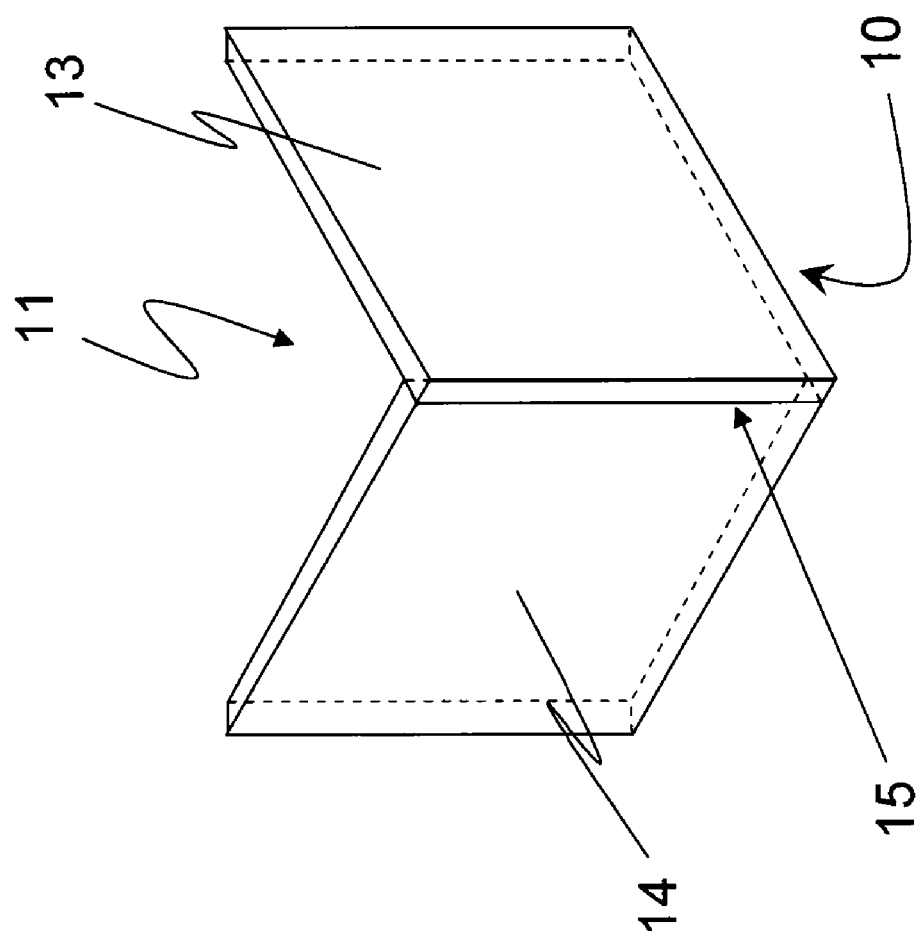

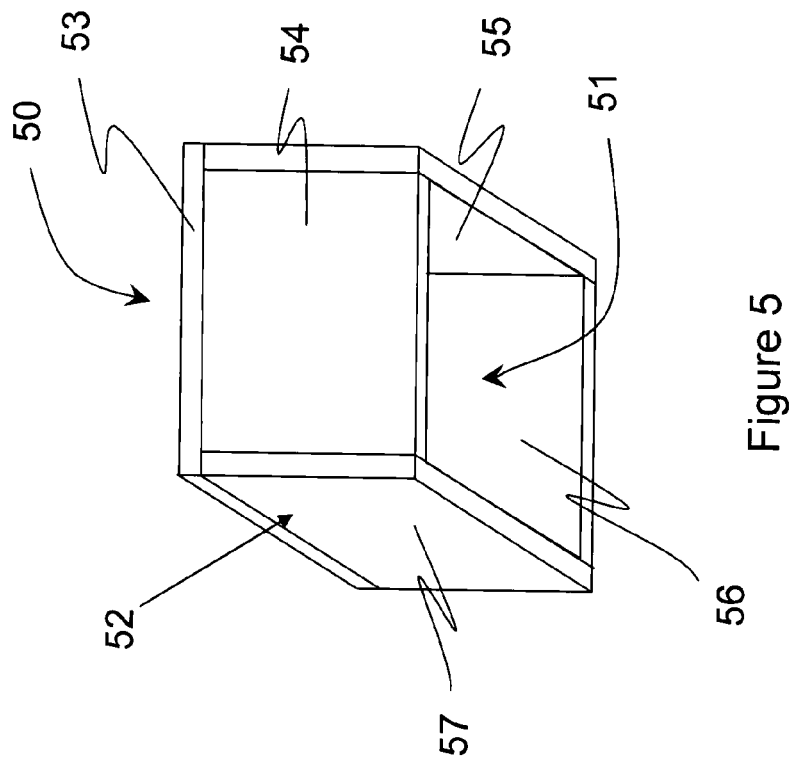
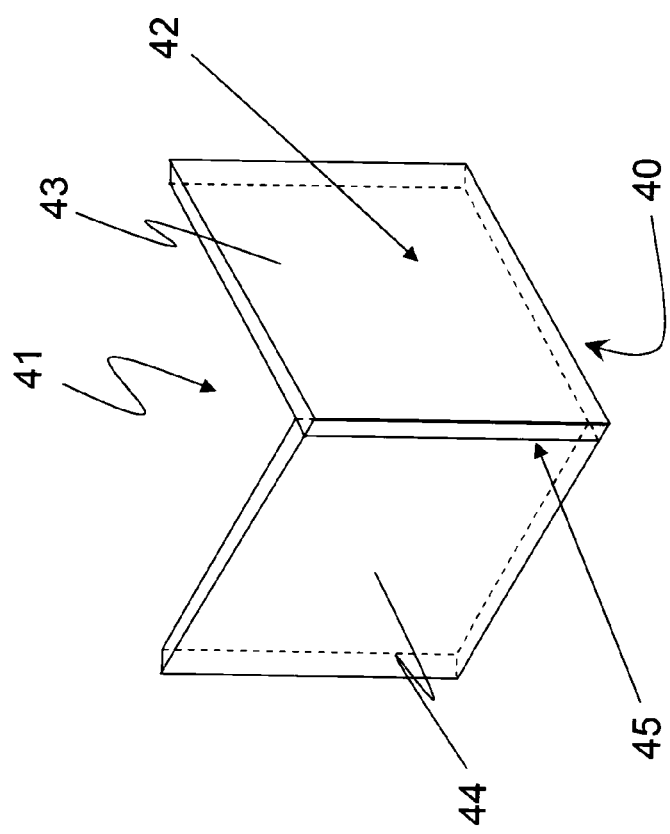
Figure 5
Figure 4

CARBON BONDED CARBON FOAM EMI SHIELDING ENCLOSURES

BRIEF SUMMARY OF THE INVENTION

The present invention is directed to enclosures for at least partially shielding an at least partially enclosed volume from electromagnetic interference and various methods for producing such enclosures. In certain embodiments a method for producing a carbon foam EMI shielding enclosure may comprising the steps of bonding at least two sections of carbon foam with a carbonizable binder to form an enclosure, and carbonizing the carbonizable binder to provide an electrically conductive carbon char. In some embodiments, the invention may include an enclosure for at least partially shielding an at least partially enclosed volume from electromagnetic interference that may include at least two sections of electrically conductive carbon foam interconnected together by an electrically conductive carbon char. The electrically conductive carbon char is substantially electrically continuous with the sections of electrically conductive carbon foam.

BRIEF DESCRIPTION OF THE DRAWINGS

FIG. 1 illustrates an enclosure in accordance with an embodiment of the invention.

FIG. 4 illustrates an enclosure in accordance with still another embodiment of the invention.

FIG. 5 illustrates an enclosure in accordance with a further embodiment of the invention.

DETAILED DESCRIPTION OF EMBODIMENTS OF THE INVENTION

Figure 3:
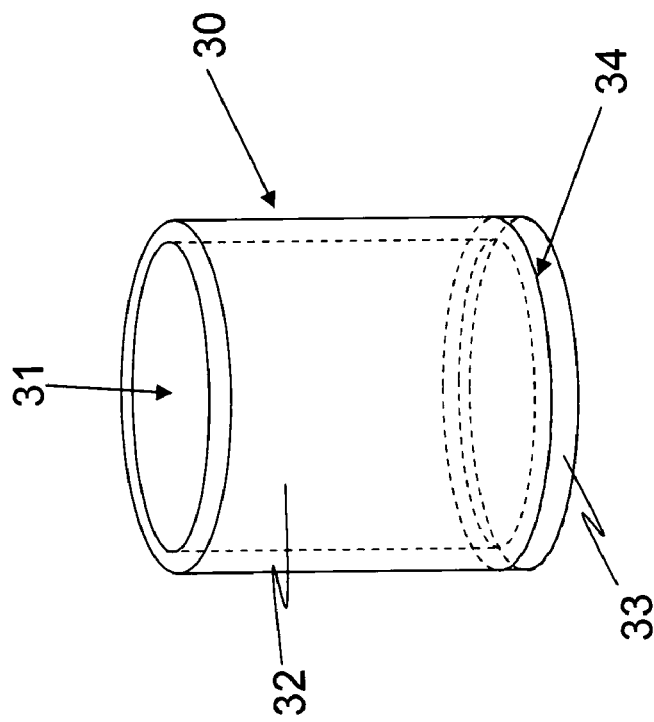
FIG. 3 illustrates an enclosure in accordance with yet another embodiment of the invention.

Electrically conductive carbon foams are effective in blocking high frequency electromagnetic interference (EMI) such as that generated by microwave emitters, including radar sources. Typically, such electrically conductive carbon foams have an electrical resistivity of less than about 1 ohm-cm and in some instances less than about 0.1 ohm-cm. Such electrically conductive carbon foams may be used to at least partially form the walls of enclosures, or shelters, having interior volumes which are shielded from such EMI. The interior volumes of these enclosures provide areas, for example, in which personnel, electronic equipment, and/or items and materials may be sheltered and function without the negative effects that may result from exposure to such interference.

It has been found that such enclosures may provide very effective EMI shielding. The electrically conductive carbon foam comprising the EMI-contacting enclosure walls is typically arranged such that the carbon foam provides for an essentially continuous surface within or over those walls. Breaks, separations, cracks, or the like, in this essentially continuous electrically conductive carbon foam surface may significantly degrade the EMI shielding effectiveness of the enclosure.

Carbon foam is commercially available in sheet form. Therefore the construction of such enclosures requires that these sheets be pieced together to provide the shelter walls. In some methods, neighboring sheets of electrically conductive carbon foam are bonded to each other over the entire joining line using selected electrically conductive adhesives. In other methods, neighboring sheets of electrically conductive carbon foam may be mutually bonded to an intermediate non-sheet piece of electrically conductive carbon foam along the entire joining lines using selected electrically conductive adhesives. The use of such electrically conductive adhesives is intended to eliminate any breaks, separations, cracks, loss of electrical conductivity, or the like, between neighboring electrically conductive carbon foam sections. In this manner a continuous electrically conductive enclosure surface may be obtained.

The use of electrically conductive adhesives for the bonding of neighboring carbon foam sheets and/or non-sheet pieces (which may be referred to collectively as carbon foam sections), does not invariably result in a bond that exhibits sufficient shielding effectiveness. Although electrically conductive, many of the commercially available electrically conductive adhesives may not adequately, or reliably, block high frequency EMI. This inadequate EMI blocking may result in some joining lines between electrically conductive carbon foam sections having the appearance of breaks, separations, cracks, or the like, with respect to the shielding effectiveness of the enclosure. That is, the adhesive bonding between the carbon foam sections may provide pathways for entry, (i.e. "leakage") of EMI into the enclosure interior, thus degrading the shielding effectiveness of the enclosure.

With reference now to FIG. 1, an enclosure 10 in accordance with an embodiment of the invention is illustrated. At least two electrically conductive carbon foam walls 13 and 14 define a partially enclosed volume 11. The electrically conductive carbon foam walls 13 and 14 are interconnected at an interconnection region 15 by carbon char. In some embodiments, the carbon foam walls 13 and 14 and carbon char in the interconnection region 15 together exhibit a carbon structure that is not continuous. For example, in some embodiments, grain boundaries in the carbon char may clearly evident throughout the interconnection region 15. Upon magnified inspection, the visible structure of the carbon comprising both the carbon foam and the carbon char are non-continuous with boundaries between them clearly evident. The carbon char is electrically conductive and in some embodiments is at least as electrically conductive as the carbon foam walls. In various embodiments, the carbon char and the carbon of the carbon foam walls 13 and 14 exhibit a substantially electrically continuous interconnection between the carbon foam walls 13 and 14 and the carbon char in the interconnection region 15.

Embodiments of the present invention provide for carbon foam EMI shielding enclosures comprised of two or more sections of electrically conductive carbon foam bonded together by electrically conductive carbon char and having at least one wall. The carbon char is typically along the joining lines, or surfaces, of those sections. Such enclosures may minimize the number of, and in some embodiments eliminate, adhesive bonds between neighboring carbon foam sections as previously used to form EMI shielding enclosures. Such minimization or elimination is provided by bonding at least two neighboring sections of electrically conductive carbon foam together with electrically conductive carbon char to provide an enclosure. This is in contrast to previous carbon foam EMI shielding enclosures comprised of two or more sections of carbon foam bonded together solely with a conductive adhesive. The bonding together of neighboring electrically conductive carbon foam sections with electrically conductive carbon char may provide for an enclosure capable of shielding a volume, typically a partially enclosed volume of said enclosure, from electromagnetic interference (EMI). An at least partially enclosed volume is that space, area or volume near an enclosure that is at least partially shielded from EMI when the enclosure is located between a source of EMI and an object to be shielded. In some embodiments, a partially enclosed volume may be defined or provided behind a planar configuration of carbon foam sections or behind one or more curved sections of carbon foam. Further, a partially enclosed volume may be provided behind two or more sections of carbon foam that intersect at an angle greater than zero degrees. As a result, personnel, electronic equipment, and/or items and materials, which may be collectively referred to as objects, located within the partially enclosed volume of the enclosure are then at least partially shielded from EMI. That electromagnetic interference may be in the range of about 400 MHZ to about 18 GHZ. At least partially shielded from EMI includes a reduction in EMI exposure to the partially enclosed volume when the enclosure is exposed to EMI. In certain embodiments, the reduction in EMI may be a partial reduction or an essentially complete reduction. In some embodiments the reduction in EMI may range from about 1% to about 100%. In other embodiments the reduction in EMI may range from about 10% to about 80%. In still other embodiment the reduction in EMI may range from about 99% to about 100%. In some embodiments, both the electrically conductive carbon foam and the electrically conductive carbon char may have an electrical resistivity of less than about 1 ohm-cm and in some embodiments less than about 0.1 ohm-cm. Additionally, in some embodiments, the electrically conductive carbon foam may have a density ranging from about 0.05 g/cc to about 1.5 g/cc. In other embodiments, the electrically conductive carbon foam may have a compressive strength ranging from about 50 p.s.i. to about 12,000 p.s.i.

The EMI shielding carbon foam enclosures of the present invention, which may be referred to as a carbon bonded carbon foam EMI shielding enclosures, or more simply as carbon bonded shielding enclosures, are further characterized as comprising one or more walls which at least partially enclose or otherwise define at least a partially enclosed volume. In some embodiments, the enclosure minimally has two planer walls, wherein the length and width of each define planes intersecting at an angle of greater than zero degrees. In other embodiments, the enclosure minimally has two planer walls, wherein the length and width of each define planes intersecting at an angle of about zero degrees. Alternatively, in other embodiments, the enclosure has at least one wall curved in at least one plane intersecting that wall. The surface of the curved wall may define, for example, an arc, a circle, a polygon, an ellipse, a parabola, portions thereof, or the like, in that plane.

The wall(s) of the carbon bonded shielding enclosures comprise two or more sections of electrically conductive carbon foam. Combined, the sections of carbon foam may be essentially the same size as the walls of the carbon bonded shielding enclosure and essentially continuous through those walls except where bonds between neighboring sections of carbon foam occur. At least two of the sections of electrically conductive carbon foam are bonded together by electrically conductive carbon char. This electrically conductive carbon char may be derived from a carbonizing binder and extends the length of the bonding line between the carbon foam sections. The electrically conductive carbon foam and the electrically conductive carbon char are electrically continuous in that an electrical current may pass between the carbon foam sections and carbon char.

The carbon bonded shielding enclosure may be used to at least partially shield personnel, electronic equipment, objects, materials, and the like, (herein referred to collectively as objects) in the at least partially enclosed volume from EMI. Such shielding is provided by positioning the object to be shielded in the at least partially enclosed volume defined by the enclosure walls, where those wall(s) are positioned between said objects and the source of the EMI.

In some embodiments, the method of the invention entails bonding at least two sections of carbon foam together with a carbonizable binder, applied to the joining surfaces of the carbon foam sections along the length of the bonding or joining line, to produce an initial carbon foam enclosure. For those carbon foams that are electrically conductive, subsequent carbonization of the carbonizable binder, to result in an electrically conductive carbon char, provides for a carbon bonded shielding enclosure. For those carbon foams that are not electrically conductive, subsequent essentially simultaneous carbonization of the carbonizable binder, to result in an electrically conductive carbon char, and of the carbon foam, to result in electrically conductive carbon foam, provides for a carbon bonded shielding enclosure.

The carbon foam may be any carbon foam. In some embodiments, the carbon foam section is a flat or curved panel or sheet. Non-sheet pieces of carbon foam may also be utilized as carbon foam sections in some embodiments. Such carbon foams may be produced using any known feedstock and associated process. The carbon foam may be any produced, for example, from pitches, mesophase pitches, mesophase carbon, coal, coal extracts, coal derivatives, carbonizing polymeric resins, and the like, using known processes. In some embodiments, the carbon foam exhibits an electrical resistivity less than about 1 ohm-cm. In other embodiments, the carbon foam has an electrical resistivity of minimally less than about 0.1 ohm-cm. In still other embodiments, the carbon foam has an electrical resistivity greater than about 1 ohm-cm.

The carbonizable binder may be a composition or material that produces a significant yield of electrically conductive carbon char upon carbonization at suitable temperatures. When carbonized at suitable temperatures, the carbon char may exhibit an electrical resistivity less than about 1 ohm-cm. In other embodiments, the carbon char may exhibit an electrical resistivity of minimally less than about 0.1 ohm-cm. In some embodiments, the amount of carbon derived from the carbonizable binder (i.e. char yield) is of sufficient quantity, and possesses sufficient cohesion, to provide a strong electrically conductive bond between the sections of carbon foam comprising the carbon bonded shielding enclosure when carbonized at suitable temperatures.

Curing or drying of the carbonizable binder may be necessary to develop maximum bond strength between the sections of carbon foam prior to carbonization. The carbonizable binder may be dissolved in or wet with a solvent. Suitable carbonizable binders may comprise, but are not limited to, phenolic resins, resorcinol resins, furan resins, pitch, tars, asphalt, bitumins, mesophase pitch, mesophase carbon, thermosetting polymers, lignosulfonates, graphite adhesives, coking coals, solvent refined coals, coal extracts, solvent refined coal byproducts, hydrogenated coals and associated byproducts, and the like. Some carbonizable binders may be used in combination with other carbonizable binders. Comminuted graphite, coal, coke, carbon foam and the like, for example, may be combined with some carbonizable binders to increase the resulting char yield of the binder. Comminuted filler materials, including but not limited to, ceramics, metals, and the like, may be dispersed in the carbonizable binder. The carbonizable binder may comprise other materials. These other materials typically do not contribute any significant amount of carbon or other solid material to the carbonized carbonizing binder. The function of these other materials may be to provide for additional bond strength in the enclosure prior to carbonization of the binder. Such other materials may include, but are not limited to, non-carbonizing commercial adhesives, non-carbonizing polymers, cellulosic materials, and the like, whether used neat or solvated.

The carbonizable binder may be liberally applied to all portions of the joining edges or surfaces of the carbon foam sections where mutual contact occurs or is desired. In some embodiments, the carbonizable binder may be applied along the length of the bonding, or joining, line(s) between the carbon foam sections. In some embodiments, a sufficient quantity of carbonizable binder may be applied to the contacting surfaces to provide for good contact between the binder on opposing surfaces. The carbonizable binder, depending on desired type and formulation, may be applied dry, as a paste, as a slurry, or as a, typically viscous, liquid material, mixture, or solution. In the case of carbonizable binder slurries or liquids, pre-wetting of the carbon foam mutual contacting surfaces, with a miscible solvent, or the same liquid as used to produce the slurry or solution, may aid in application and provide for a more uniform distribution of the binder. Partially or fully filling the cells of the carbon foam sections at the contacting surfaces with the carbonizable binder may provide for stronger bonds. For those carbonizable binders at least partially comprised of a solid material, the particles size of the solid material may be smaller, even to orders of magnitude smaller, than the cell size of the carbon foam. Bond strength between the carbon foam sections may be improved if contact between the carbon foam of the opposing sections contacting surfaces is essentially maintained after application of the carbonizing binder.

In some embodiments, the carbonizable binder exhibits a bond strength sufficiently strong so as to maintain the bond(s) between the carbon foam sections of the initial carbon foam enclosure during routine handling and heating of the binder to carbonization temperatures. If such strength is lacking, or as desired, the bonded carbon foam sections of the initial carbon foam enclosure may be secured in the desired orientation(s) with clamps and other such retaining devices. Such retaining devices may be comprised of materials that can tolerate the elevated temperatures to which the initial carbon foam enclosure may be subjected to convert the carbonizable binder to electrically conductive carbon char. Such retaining devices may have a coefficient of thermal expansion substantially similar to that of the carbon foam.

The bonded carbon foam sections of the initial carbon foam enclosure may also be secured in the desired orientation(s) by gravity and/or design of the mutually contacting surfaces of the carbon foam sections. Such designs for joining the carbon foam sections may encompass those that are common to the carpentry arts. For example, butt joints, lap joints, dovetail joints, tongue and grove joints, mortise joints, V-groove joints, and the like can all be used, in combination with the carbonizable binder, to join carbon foam sections together. Such methods may result in strong bonding between the sections of carbon foam and appreciable strength and high electrical conductivity in the resulting carbon bonded shielding enclosure.

In some embodiments, the carbonizing adhesive may only penetrate a joining surface of the carbon foam to a relatively shallow depth. As such, for example, lap and butt joints between sections of carbon foam may show good resistance to shear forces but relatively low resistance to tensional forces. Alternatively, other joints such as, for example, tongue and grove joints, mortise joints, and dovetail joints may show good resistance to both shear and tensional forces. Therefore, in some embodiments, joints designs providing good resistance to both shear and tensional forces may be preferred.

Once the carbon foam sections are bonded together using the selected carbonizing binder, the binder is carbonized by heating to elevated temperatures. Heating may be performed after the carbonizing binder has cured or dried, if necessary. Such heating serves to progressively carbonize the carbonizing binder, and carbon foam as necessary, to produce the carbon bonded shielding enclosure of the present invention. In such an enclosure, the carbon foam comprising the enclosure is preferably electrically continuous with the carbon char derived from the carbonizing binder. Therefore the carbon material comprising the enclosure may be electrically continuous.

The method used to heat the carbonizable binder to effect carbonization of the binder is not particularly limited. For those initial enclosures comprised of a carbonizing binder and electrically conductive carbon foam, it may only be necessary to heat the carbonizable binder to an elevated temperature sufficient to result in an electrically conductive char. In many instances, however, it may be more expedient the heat the initial enclosure, including both the electrically conductive carbon foam and carbonizable binder, to an elevated temperature sufficient to result in an electrically conductive char. For those initial enclosures comprised of a carbonizing binder and non electrically conductive carbon foam, heating of the initial enclosure, including both the carbon foam and carbonizable binder, to an elevated temperature, sufficient to result in electrically conductive char and electrically conductive carbon foam, may be required.

The method of heating the carbonizable binder, and in some embodiments the enclosure including the carbon foam, to progressively higher temperatures is such that the carbon foam does not break, crack, or otherwise degrade. Such degradation may be the result of significant internal thermal stresses produced in the carbon foam as a result of severe thermal gradients. Suitable heating rates may be highly dependent on the size and configuration of the enclosure and the characteristics of the heating device. In certain embodiments heating rates of 1° C./min may be suitable. The maximum heating rate that can be used without degradation of the enclosure may be established by routine experimentation. Heating may be conducted in a non-reactive, oxygen free, or otherwise inert atmosphere. Likewise, cooling may be conducted in a non-reactive, oxygen free, or otherwise inert atmosphere until the carbon temperature is minimally less than about 400° C. and more preferably less than about 150° C. Such heating may be conducted in conventional industrial-like ovens and furnaces capable of maintaining controlled atmospheres and temperatures.

Heating to a maximum desired elevated temperature may be conducted in a continuous manner. Alternatively, such heating may be conducted as a series of steps performed in one or more pieces of heating equipment. For example, one type of furnace may be utilized to initially carbonize the binder and another type, or types, of furnace utilized to further carbonize the binder. As an alternative example, a single furnace may be utilized to initially carbonize and then further carbonize the binder. Such heating in a single furnace may be even to graphitization temperatures.

As discussed herein, carbonization of the carbonizing binder may be considered to initiate at temperatures greater than about 200° C. and less than about 700° C. and may be further conducted at temperatures greater than about 700° C., even to temperatures as great as about 320° C. or higher. Graphitization temperatures are a subset of the range of carbonization temperatures and are usually considered to extend from about 1700° C., up to about 3200° C. or higher. In some embodiments, the electrical conductivity of carbon material comprising the char and the foam increases with respect to the maximum temperature to which the carbon material has been exposed, typically during preparation. In some embodiments, the carbon char derived from the carbonizing binder, and the carbon foam as necessary, are heated to a temperature sufficiently high to result in the carbon char and foam of the enclosure having an electrical resistivity of less than about 1. ohm-cm. For some carbon chars and foams, such a temperature may be greater than about 900° C. In some embodiments, heating the carbon char, and carbon foam as necessary, to temperatures greater than about 1000° C. may provide for higher electrical conductivities. If desired, the carbon of the enclosure may be heated to temperatures as great as 3200° C. or more.

It is envisioned that the carbonizable binder may be carbonized to provide the desired electrical resistivity without heating the entire carbon foam enclosure. Such heating may be accomplished by the application of heat to the carbon foam of the enclosure in only those areas or volumes essentially contacting or surrounding the carbonizable binder. In the production of EMI shielding enclosures, such localized heating to carbonize the carbonizable binder may be most applicable to those carbon foams already having an electrical resistivity in the desired range. Such localized heating could potentially be accomplished by localized application of relatively high energy heat sources such as gas burners, radiant heaters, resistive heaters, and the like to the outer surface(s) of the carbon foam volume in closest proximity to the carbonizable binder. Additionally, the carbon foam essentially surrounding the carbonizable binder is typically electrically conductive. Therefore, it may be possible to resistively heat this carbon foam, by directing an electric current through the foam, to sufficient temperatures to result in the carbonization of the neighboring carbonizable binder. Furthermore, the carbon foam essentially surrounding the carbonizable binder is expected to interact with microwaves and/or inductive fields. Therefore it may be possible to heat to the carbon foam enclosure in only those areas or volumes essentially contacting or surrounding the carbonizable binder by the directed application of microwave energy or an inductive field. As was discussed above, heating and cooling, even of localized areas, of the enclosure should preferably be conducted in a non-reactive, oxygen free, or otherwise inert atmosphere.

If the dimensions of the as-produced carbon bonded shielding enclosure are not within the tolerances desired, the carbon of the enclosure may be machined to the desired dimensions. Machining may be accomplished by the use of conventional methods. Carbide tooling is typically recommended for such machining.

The walls of the carbon bonded shielding enclosure may be surfaced coated, covered, or faced with other materials. These other materials may extend from the walls of the enclosure in a manner coplanar with those walls. Alternatively, such other materials may extend form the carbon foam walls in a non coplanar manner. Such other materials may provide, for example, additional wall strength, bracing at wall intersections, waterproofing, weather shielding, impact resistance, and the like. Such other materials may comprise, but are not limited to, carbon foam, fiberglass, thermosetting and thermoplastic polymers, ceramics, paint, polymer composites, carbon composites, wood, paper, metals, metal composites, and the like. Such other materials may be applied, for example, by dipping, spraying (including thermal spraying), lay-up methods, painting, gluing, mechanical fasteners, deposition (including chemical vapor deposition and vacuum deposition), and the like. The carbon foam of the carbon bonded shielding enclosure may also be impregnated with thermosetting polymers, thermoplastic polymers, resins, ceramics, metals, and the like. Interior or exterior supports may be affixed to the carbon foam comprising the carbon bonded shielding enclosure. Such supports may be comprised of any solid material having sufficient strength to provide additional support to the carbon foam of the wall. Such solid materials may include, but are not limited to, wood, composites, metals, and carbon foam. Carbon foam supports may be continuous with the carbon foam of the wall. Additional walls, which may comprise carbon foam, may be attached to the carbon foam walls of the carbon bonded shielding enclosure using conventional methods. Such additional walls may provide the enclosed volume of the carbon bonded shielding enclosure with, for example, weather protection, thermal shielding, impact protection, and a less sure, and most likely lower, degree of EMI shielding that may supplement the shielding effectiveness of the enclosure.

The carbon bonded shielding enclosures of the present invention may be used in many of the numerous applications for which conventional enclosures find utility. The electrically conductive carbon comprising the walls of the enclosures of the present invention may provide these enclosures with differentiated beneficial properties which may make such enclosures particularly suitable as electromagnetic interference shielding enclosures.

Example 1

Figure 2:
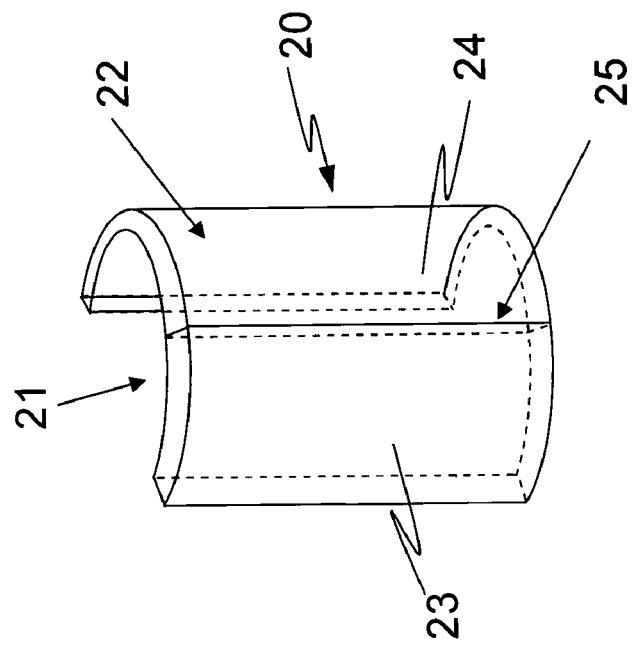
FIG. 2 illustrates an enclosure in accordance with another embodiment of the invention.

With reference now to FIG. 2, there is illustrated an enclosure 20 in accordance with an embodiment of the invention. The enclosure 20 has two curved sheets of carbon foam 23 and 24 bonded together by a carbonizable binder 25. Such a curved enclosure 20 provides a partially enclosed volume in area 21 partially bounded by a carbon foam wall 22. The carbon foam wall is comprised of two curved sheets of carbon foam 23 and 24, bonded together at their mutual contacting surfaces by a carbonizable binder 25. This enclosure has one wall curved in at least one plane intersecting that wall. The surface of the curved carbon foam wall defines a partial ellipse in that plane. The enclosure 20 is heated to an elevated temperature to carbonize the carbonizable binder 25 to form carbon char. The carbon foam and char comprising the enclosure are electrically conductive and electrically continuous through all walls and joining surfaces. In some embodiments, the carbon foam and carbon char may exhibit electrical resistivities of less than about 1 ohm-cm. In other embodiments, the carbon foam and carbon char may exhibit electrical resistivities of less than about 0.1 ohm-cm. The surface of such a carbon bonded shielding enclosure may be coated, covered, or faced with any of a number of materials as discussed above. The carbon foam may be impregnated as discussed above. Supports of other material(s) may be attached to the wall as also discussed above.

Such a carbon bonded shielding enclosure may be prepared by bonding two curved sheets of carbon foam together using a carbonizable binder to provide an initial carbon foam enclosure. The carbonizable binder is first applied liberally to the planned joining edges or surfaces of the carbon foam sheets. The joining edges are then brought into mutual contact and the carbonizable binder cured or dried as necessary to provide the initial carbon foam enclosure. Mechanical aids may be used to maintain the mutual orientation of the joined edges of the carbon foam sheets during or after curing or drying of the carbonizable binder. The resultant initial carbon foam enclosure is then heated to an elevated temperature as described above. This elevated temperature is sufficient to carbonize the binder such that the resulting carbon char, and, if necessary, the bonded carbon foam, is electrically conductive. The resulting carbon bonded shielding enclosure is then cooled from the elevated temperature to lower temperatures as described above.

Such a carbon bonded shielding enclosure may be used to shield objects in the enclosed volume from EMI. Such shielding is provided by positioning the objects and/or enclosure such that the objects are in the at least partially enclosed volume defined by the enclosure walls, where those walls are positioned between said objects and the source of the EMI.

Example 2

FIG. 3 illustrates an enclosure 30 taking the form of a hollow cylinder in accordance with another embodiment of the invention. Enclosure 30 provides a partially enclosed volume 31. The walls of such an enclosure are comprised of a hollow cylinder of carbon foam 32 and a flat sheet of carbon foam 33 continuously bonded together at their mutual contacting surfaces by a carbonizable binder 34. This enclosure has two walls which at least partially enclose or otherwise define at least a partially enclosed volume. One wall of the enclosure is curved in one plane intersecting that wall. The surface of the curved carbon foam wall defines a circle in that plane. The other wall is parallel to that intersecting plane. The enclosure 30 is heated to an elevated temperature such that the carbonizable binder 34 is converted into a carbon char. The carbon foam and carbon char comprising the enclosure are electrically conductive through all walls and joining surfaces. The surface of such a carbon foam enclosure may be coated, covered, or faced with any of a number of materials as discussed above. The carbon foam may be impregnated as discussed above. Supports of other material(s) may be attached to the wall as also discussed above.

Such a carbon foam enclosure may be used to shield objects in the enclosed volume from EMI. Such shielding is provided by placing said objects in the at least partially enclosed volume defined by the enclosure walls, where those walls are positioned between said objects and the source of the EMI. If the major dimensions of the carbon foam cylinder are on the order of inches, such a closed end carbon foam cylinder may be used, for example, to shield electronic components from EMI. If the major dimensions of the carbon foam enclosure are on the order of feet, such an enclosure may be used, for example, to shield small scale equipment from EMI. If the major dimensions of the carbon foam enclosure are on the order of multiple feet, such an enclosure may be used, for example, to shield personnel and/or large scale equipment from EMI.

Example 3

Another enclosure 40 is illustrated in FIG. 4. The enclosure 40 provides a partially enclosed volume 41 bounded by carbon foam walls 42. The carbon foam walls of this enclosure are comprised of two flat sheets of carbon foam 43 and 44 continuously bonded together at their mutual contacting surfaces by a carbonizable binder 45. In this case, the carbon foam enclosure has two planer walls, each comprised of carbon foam, wherein the length and width of each define intersecting planes which enclose or otherwise define at least a partially enclosed volume. In this example, the carbon foam walls are each comprised of one section of carbon foam. In other embodiments, the walls may be comprised of multiple sections of carbon foam bonded together at there mutual contacting surfaces by a carbonizing binder. The enclosure 40 is heated to an elevated temperature to carbonize the carbonizable binder 45 to form carbon char. The carbon foam and carbon char comprising the enclosure are electrically conductive and electrically continuous through all walls and joining surfaces. The surface of such a carbon foam enclosure may be coated, covered, or faced with any of a number of materials as discussed above. The carbon foam may be impregnated as discussed above. Supports of other material(s) may be attached to the wall as also discussed above. The utility of such a carbon foam enclosure may be, but is not limited to, any of those discussed above.

Example 4

With reference now to FIG. 5 an enclosure 50 in accordance with yet another embodiment of the invention is illustrated. The enclosure 50 provides a partially enclosed volume in area 51 partially bounded by carbon foam walls 52. The carbon foam walls of this enclosure are comprised of five flat sheets of carbon foam 53, 54, 55, 56, and 57, continuously bonded together at their mutual contacting surfaces by a carbonizable binder. In this case the enclosure has five planer walls, each comprised of carbon foam, wherein the length and width of each define intersecting planes which enclose or otherwise define at least a partially enclosed volume. The enclosure 50 is heated to an elevated temperature to carbonize the carbonizable binder to form carbon char. The carbon comprising the enclosure is electrically conductive and electrically continuous through all walls and joining surfaces. The surface of such a carbon foam enclosure may be coated, covered, or faced with any of a number of materials as discussed above. The carbon foam may be impregnated as discussed above. Supports of other material(s) may be attached to the wall as also discussed above. The utility of such a carbon foam enclosure may be, but are not limited to, any of those discussed above.

Example 5

Figure 6:
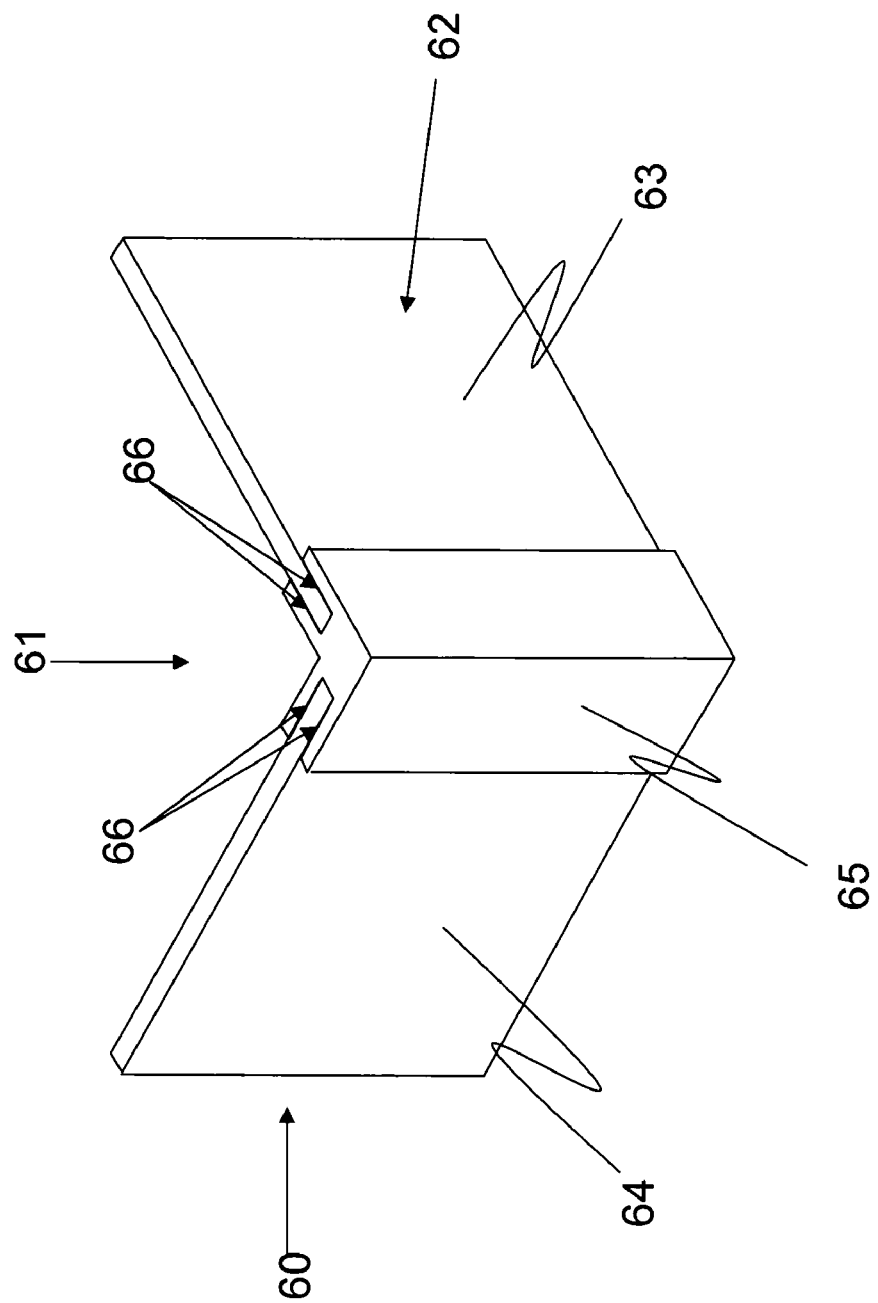
FIG. 6 illustrates an enclosure in accordance with an additional embodiment of the invention.

FIG. 6 illustrates an enclosure 60 defining a partially enclosed volume 61 bounded by carbon foam walls 62 and a corner piece of carbon foam 65. The carbon foam walls of this enclosure are comprised of two flat sheets of carbon foam 63 and 64 continuously bonded to a non-sheet corner piece of carbon foam 65 at their mutual contacting surfaces by a carbonizable binder 66. The carbon foam corner piece 65 is designed to have two grooved slots into which edges of the carbon foam sheets are inserted, tongue and groove fashion. Such a design may provide for substantially improved joint strength.

In this case, the carbon bonded shielding enclosure has two planer walls, each comprised of carbon foam, wherein the length and width of each define intersecting planes which enclose or otherwise define at least a partially enclosed volume. The enclosure 60 is heated to an elevated temperature to carbonize the carbonizable binder 66 to form carbon char. The carbon comprising the enclosure is electrically conductive and electrically continuous through all walls and across all joining surfaces. The surface of such a carbon foam enclosure may be coated, covered, or faced with any of a number of materials as discussed above. The carbon foam may be impregnated as discussed above. Supports of other material(s) may be attached to the wall as also discussed above. The utility of such a carbon foam enclosure may be, but is not limited to, any of those discussed above.

Various embodiments of the present invention have been discussed above in detail. The present invention has broad applicability to a wide variety of configurations that will be readily apparent to those skilled in the art. The invention is limited only by the appended claims.

What is claimed is:

1. An enclosure for at least partially shielding an at least partially enclosed volume from electromagnetic interference, the enclosure comprising:
at least two sections of electrically conductive carbon foam interconnected by an electrically conductive carbon char that is substantially electrically continuous with the carbon foam of the at least two sections, wherein the at least two sections of electrically conductive carbon foam define an at least partially enclosed volume, and wherein the at least two section of electrically conductive carbon foam are bonded together by the electrically conductive carbon char that is electrically continuous between the electrically conductive carbon foam sections, and wherein the electrically conductive carbon char is derived from the carbonization of a carbonizing binder bonding the carbon foam sections of the enclosure such that the carbonization of the carbonizing binder results in the electrically conductive carbon char that is electrically continuous between the electrically conductive carbon foam sections.

2. The enclosure of claim 1, wherein at least one of said at least two sections of electrically conductive carbon foam comprises a carbon foam section curved in at least one plane.

3. The enclosure of claim 1, wherein said at least two sections of electrically conductive carbon foam intersect at an angle greater than zero degrees.

4. The enclosure of claim 1, wherein said electrically conductive carbon foam has an electrical resistivity less than about 1 ohm-cm.

5. The enclosure of claim 1, wherein said electrically conductive carbon foam has an electrical resistivity less than about 0.1 ohm-cm.

6. The enclosure of claim 1, wherein at least one surface of at least one of said at least two sections of electrically conductive carbon foam comprises a coated surface.

7. The enclosure of claim 6, wherein said coated surface is selected from the group consisting of carbon foam, fiberglass, thermosetting polymers, thermoplastic polymers, ceramics, paint, polymer composites, carbon composites, wood, paper, metals, and metal composites.

8. The enclosure of claim 6, wherein said coated surface comprises at least partial impregnation of an impregnating material selected from the group consisting of thermosetting polymers, thermoplastic polymers, resins, carbon, ceramics, and metals.

9. The enclosure of claim 1, further comprising a support member affixed to at least one of said at least two sections of electrically conductive carbon foam.

10. The enclosure of claim 9, wherein said support member is comprised of a support material selected from the group consisting of solid polymers, wood, composites, metals, and carbon foam.

11. The enclosure of claim 1, wherein said at least two sections comprise carbon foam having a compressive strength ranging from about 50 p.s.i. to about 12,000 p.s.i.

12. The enclosure of claim 1, wherein said at least two sections comprise carbon foam having a density ranging from about 0.05 g/cc to about 1.5 g/cc.

* * * * *